United States Patent
Ashley

(10) Patent No.: US 7,030,627 B1
(45) Date of Patent: Apr. 18, 2006

(54) WIDEBAND COMPLEX RADIO FREQUENCY IMPEDANCE MEASUREMENT

(75) Inventor: William B. Ashley, Carlsbad, CA (US)

(73) Assignee: AEA Technology Inc., Vista, CA (US)

( * ) Notice: Subject to any disclaimer, the term of this patent is extended or adjusted under 35 U.S.C. 154(b) by 0 days.

(21) Appl. No.: 10/928,042

(22) Filed: Aug. 27, 2004

Related U.S. Application Data

(60) Provisional application No. 60/527,324, filed on Dec. 5, 2003.

(51) Int. Cl.
    *G01R 27/28* (2006.01)
    *G01R 27/02* (2006.01)
(52) U.S. Cl. .......................... 324/650; 324/603; 702/65
(58) Field of Classification Search ................ 324/650, 324/601, 603; 702/65
    See application file for complete search history.

(56) References Cited

U.S. PATENT DOCUMENTS

| | | | | |
|---|---|---|---|---|
| 4,780,661 A | * | 10/1988 | Bolomey et al. | 324/638 |
| 5,386,194 A | * | 1/1995 | Moehlmann | 324/650 |
| 5,552,714 A | * | 9/1996 | Adamian et al. | 324/601 |
| 5,633,801 A | * | 5/1997 | Bottman | 702/65 |
| 5,708,363 A | * | 1/1998 | Yates et al. | 324/442 |
| 5,715,183 A | * | 2/1998 | Grace et al. | 702/85 |
| 5,793,640 A | * | 8/1998 | Wu et al. | 702/65 |
| 5,886,529 A | * | 3/1999 | Wakamatsu | 324/601 |
| 6,046,594 A | * | 4/2000 | Mavretic | 324/520 |

\* cited by examiner

*Primary Examiner*—Anjan Deb
(74) *Attorney, Agent, or Firm*—Michael W. Landry

(57) ABSTRACT

Impedance of an unknown load is determined by applying a reference signal from a signal generator through a multi-position switch to the unknown load, a first known calibration impedance, and second known impedance, which can be an open circuit, while measuring the complex voltage developed across each load. The source impedance of the signal generator can be determined from the measurements of the known impedances, and then the unknown impedance can be calculated, using complex voltage divider relationships. The reference signal is applied at one or more frequencies of interest and is preferably a sine wave. Impedance is measured accurately at all frequencies and the limitations of prior art frequency dependant directional-coupler methods of impedance measurement are overcome. The impedance measurement device can be incorporated into a handheld device with a keypad and display.

11 Claims, 3 Drawing Sheets

WIDEBAND COMPLEX RADIO FREQUENCY IMPEDANCE MEASUREMENT

RELATED APPLICATIONS

This application claims the benefit of U.S. provisional patent application 60/527,324 filed Dec. 5, 2003 entitled "Wideband complex radio frequency impedance measurement", incorporated herein by reference.

BACKGROUND

1. Field of the Invention

The present invention relates to impedance measurement and specifically to single port impedance measurement over a broad range of frequencies including radio frequencies.

2. Prior Art

The complex impedance associated with an electrical circuit or component is commonly measured with electronic test equipment. The complex impedance at any specific frequency consists of a real resistive portion and an imaginary reactive portion, expressed in units of Ohms. The combination of resistance and reactance offers opposition to the flow of direct and alternating current. The ratio of the complex voltage to complex current is equal to the complex impedance.

Most prior art approaches to impedance measurement use directional-couplers. FIG. 1 shows a prior art complex impedance measurement method using a directional-coupler. The forward and reverse coupled signals reflecting from the load are measured to compute the impedance of the unknown test load.

Moehlmann, U.S. Pat. No. 5,206,600 entitled "Impedance determining apparatus using quadrature current and peak detectors", incorporated herein by reference, discloses the use of directional-couplers to sample the voltage and current of a signal passing through a transmission line and derives the complex impedance parameters independently of the amplitude or phase of the signal.

De Santix, U.S. Pat. No. 4,071,819 entitled "Device for sensing the real part in a complex impedance", incorporated herein by reference, uses directional-couplers to measure the real part of a load impedance.

Another approach found in the prior art for impedance measurement is to measure an input excitation signal and an output signal from the device under test. One limitation with this approach is that it is only usable with a two port-device, having an input port and an output port. Tamamura, U.S. Pat. No. 4,860,227 entitled "Circuit for measuring characteristics of a device under test", incorporated herein by reference, discloses one embodiment of this approach, where an excitation signal is applied to the input port, with the output signal and the excitation signal frequency-converted down in frequency and sampled by A/D converters.

Hall U.S. Pat. No. 4,242,631 entitled "Front-end circuit apparatus for impedance measurement and the like", incorporated herein by reference, discloses the use of a floating transformer connected across series-coupled known and unknown impedances with grounding switches that alternately connect one terminal of the impedances to ground. The common node between the impedances is sampled to measure the unknown impedance.

Another approach to impedance measurement is to use pulse excitation of the unknown load. One example is shown in Bottman, U.S. Pat. No. 5,633,801 entitled "Pulse-based impedance measurement instrument", incorporated herein by reference, which discloses a handheld device that generates a stimulus pulse to a device under test, a measurement of the pulse response, and FFT analysis of the measured signal to determine the complex impedance of the device under test. A limitation of this approach is that the device is not tested with a signal that is representative of the type of signals normally used in the circuit's operation. Additionally, the pulse-based approach has practical limits to the frequency range that can be tested. It is preferable to test the device in question at the frequency or range of frequencies of interest rather than the frequency content represented by the pulse excitation.

A limitation of the prior art approaches to impedance measurement is that the parameters of the directional-coupler used for measurement vary with frequency, thus introducing errors into the impedance measurement of the unknown impedance. The directional-couplers are also designed for optimum performance at a specified load resistance. Connecting to impedances that are different from the specified load resistance produces secondary effects that can impair the accuracy of the directional-coupler signal measurements. The design difficulty and cost of the directional-coupler can also be significant particularly for broadband applications covering a multi-octave frequency range.

SUMMARY OF THE INVENTION

A sine wave generator produces an excitation signal that is sequentially applied to one of three different loads through a multi-position switch, the first two loads being non-identical known impedances and the third load being an unknown impedance. For example, the first known load can be an open circuit and the second known load can be 50 Ohms. The sine wave generator has a source impedance that affects the level of the signal applied to each of the loads, due to the voltage division that occurs between the source impedance and each of the loads. An analog-to-digital converter (A/D) samples the common node of the switch to measure the resulting signal on each of the loads. A sample clock controls the sampling instants of the A/D converter. The sample clock can be multi-phase and synchronous to the excitation signal. The digital samples from the A/D are collected by a digital signal processor that computes the sine wave generator source impedance from the measurements of the two known loads. The unknown load is computed from the A/D samples of the unknown load measurement by accounting for the calculated source impedance and amplitude of the excitation.

The impedance measurement system of the present invention can be used to measure the impedance of antennas, coils, amplifier input characteristics, medical imaging coils, and many other components and circuits. The measurement principle can be applied to any frequency range including radio frequencies (RF).

DETAILED DESCRIPTION OF THE INVENTION

Figure 1:
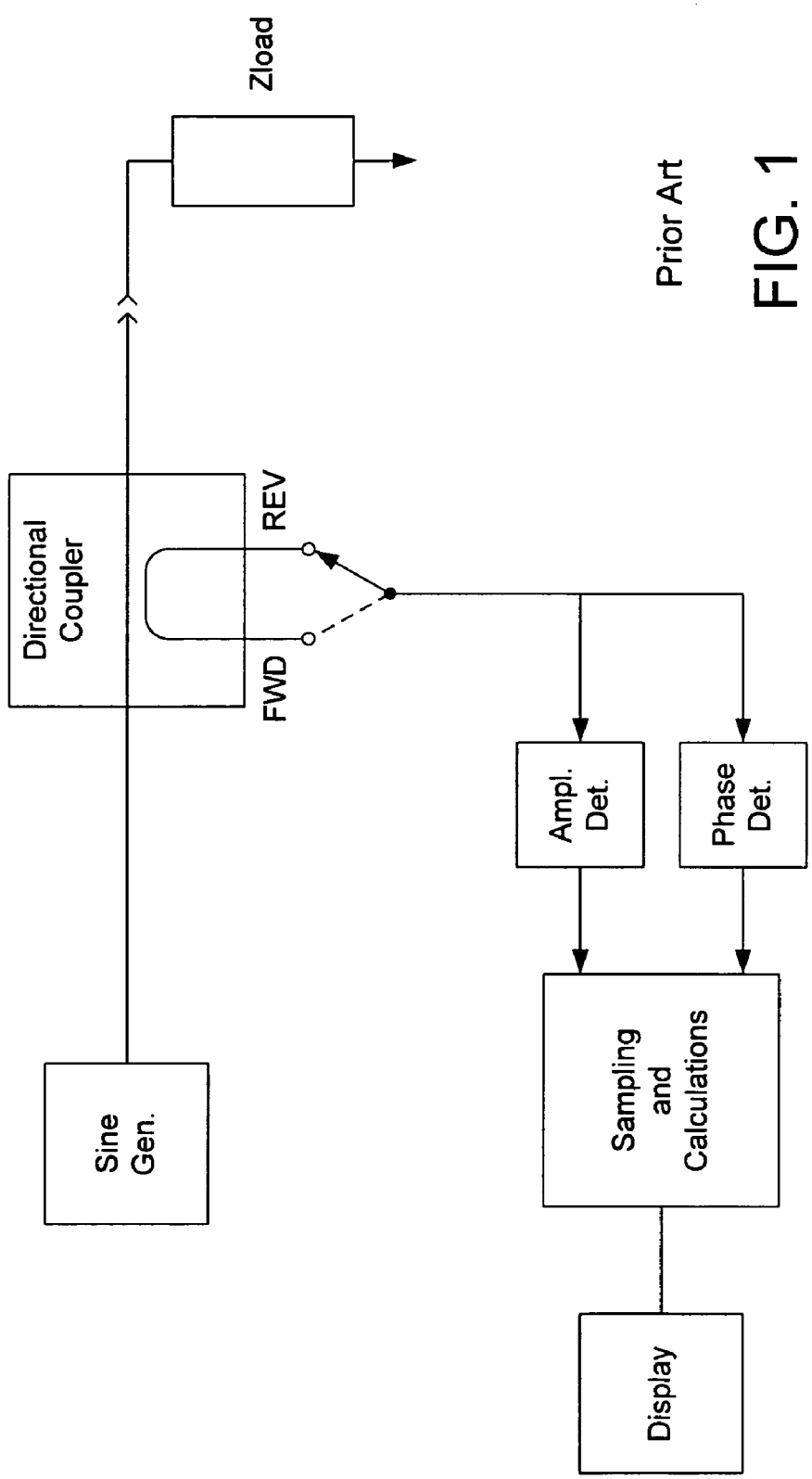
FIG. 1 shows a diagram of a prior art impedance measurement system using directional couplers.
Figure 2:
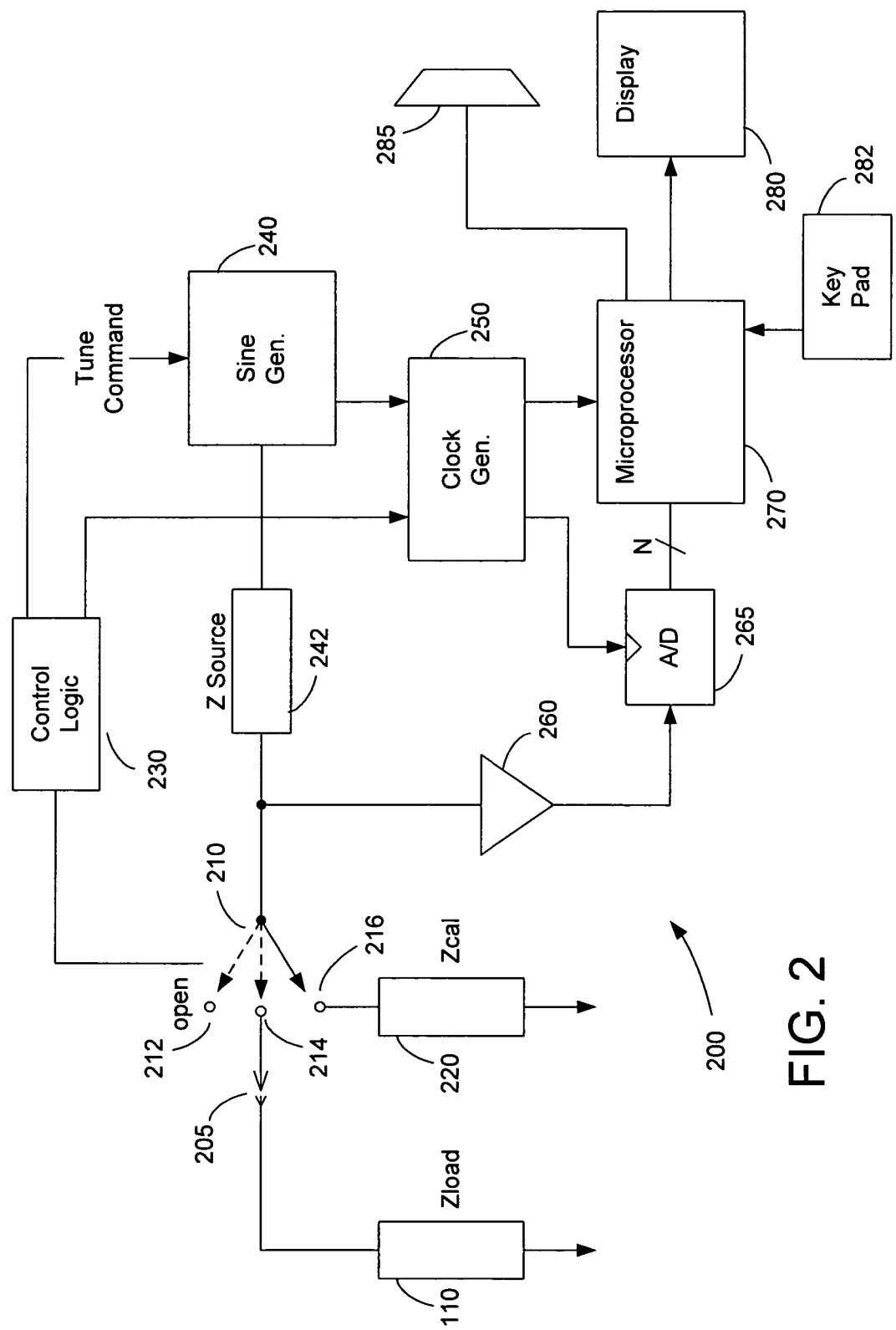
FIG. 2 shows a block diagram of the present invention impedance measurement system.

FIG. 2 shows a block diagram of an example embodiment of the impedance measurement system. Unknown load 110 is connected to impedance measurement system 200 through load connector 205, which can be an 'N', BNC, SMA, or other type of RF connector. Load connector 205 passes the signal to load switch 210. Load switch 210 connects a common point to one of three effective contact positions, an open position 212, a calibrated load position 216, or an unknown load connector position 214. Load switch 210 can be implemented with a multi-position switch or with discrete switches enabled in a mutually exclusive fashion to connect only one load at a time to the common point. The switching device used can be an electromechanical relay or solid-state switch. Although an open position is shown for 212, this position could be connected to a second calibrated load value instead of an open.

Calibrated load 220 is a precision resistor of a known value, preferably matched to the approximate impedance of the unknown load, for example 50 Ohms. Alternatively, calibrated load 220 can be another impedance value. Source impedance 242 is a combination of the intrinsic output impedance of the sine wave generator 240 and the components designed into the associated circuitry.

In order to minimize the measurement error over a wide range of unknown load impedance values, two different calibration loads can be used for load 220 and load attached at switch position 212. The calibrated load value can be selected to closely span the range of unknown impedance values anticipated. For example, one load could be chosen to be 25 Ohms and the other load could be chosen to be 150 Ohms.

Sine wave generator 240 creates the excitation signal and defines the frequency of the measurement. Impedance measurement can be made at a single frequency or over a range of frequencies by sweeping the sine wave generator. The complex impedance will normally vary with the measurement frequency due to the nature of the unknown load itself. For this reason, it is best to perform the measurement of the unknown load at the frequency or range of frequencies of interest.

Sine wave generator 240 can be implemented, for example, using a phase-locked loop (PLL) or a direct digital synthesis (DDS) frequency synthesizer, or other known approaches for signal generation. The sine wave generator can use a lowpass or bandpass filter at its output having fixed or adjustable filtering characteristics in order to improve signal purity. Unwanted harmonic distortion or spurious signals are preferably kept to a minimum level at the sine wave generator output in order to attain prescribed impedance measurement accuracy.

The common node of load switch 210 is sampled to measure the signal present at each of the switch positions. Signal conditioning circuit 260 can include a high input-impedance amplifier to minimize the disturbance caused by the measurement. Additionally, filters or other networks can process the signal to improve measurement accuracy. An isolation circuit can be used to create a differential signal and isolate the measured load from A/D 265. One example of an isolation circuit is a coupling transformer.

A/D converter 265 measures common node voltage 210 under different loading conditions at switch positions 212, 214 and 216 by quantizing the measured analog signal to N-bit digital values. The number of bits used depends upon the measurement precision desired. A 12-bit A/D converter provides sufficient resolution for a typical application. The digitized values permit the amplitude and phase of the sine wave to be computed under the different loading conditions.

Clock generator 250 generates a multi-phase sampling clock that causes A/D 265 to synchronously sample common node signal 210 at suitable time instances in the period of the sine wave test signal. Complex samples are required to separate the resistive and reactive components of the impedance. The samples can represent voltage or current measurements. The most direct and generally most accurate method to obtain complex samples is to sample the sine wave at 2 phases that are 90*(2n+1) degrees apart where n is any positive integer including zero. The multi-phase clock generator enables the A/D to sample the sine wave at these different phases. The sine wave can be sampled using phase separations other than 90 degrees, or at more than 2 phases, if the calculations performed on the samples account for the sample locations. Not suitable for use in sampling are phase sets that consist of 2 phases that are 180 degrees apart or 1 phase per sine cycle.

Samples do not need to be taken at the same frequency as the sine wave test signal. To reduce the speed of operation of the A/D converter, samples can be taken at a reduced rate that is synchronized with the sine wave test signal. For example, clock generator 250 can output a full octave sample clock in the 25 to 50 MHz range that is a fraction or multiple of the excitation signal and at a specific phase position in the sine period. The excitation signal can be, for example, 100 kHz to 200 MHz.

After the A/D captures a number of samples at one sampling phase, clock generator 250 switches the sampling phase and the A/D captures another batch of samples. The samples of each batch are averaged to produce a number that represents the measurement at each phase of the excitation signal. The full set of samples is taken over a relatively short time interval and the unknown load is assumed to remain constant during the test.

A short aperture time for sampling the waveform is desirable. A high-speed sample-and-hold can be used before the A/D or integrated into the A/D in order to insure that the sample aperture time does not adversely affect the precision of the impedance measurement.

In one embodiment, a 4-phase clock is used that causes the A/D to sample batches of 256 samples at each of the phases of the clock. A multiplexer selects which phase is sent to the A/D at any point in time. A total of 1024 samples are taken at each of the three switch positions, and the unknown impedance is calculated using the well known complex-valued voltage divider relationship. When I and Q samples are collected in blocks, the coherence time of the sine wave generator will influence the measurement error and a stable generator is used to achieve the desired accuracy. The 180-degree paraphase clock samples are combined using invert-and-add to result in a set of in-phase (I) and quatrature phase (Q) value samples for the complex calculations. The results are displayed numerically and graphically.

An alternative approach to collecting data at several points in the sine wave cycle is to generate a single phase A/D sampling clock synchronous with the generated sine wave and changing the phase of the generated sine wave by adding a selectable phase offset. In the case of a DDS synthesizer, the phase can be selected by adding an offset to the numerically controlled oscillator (NCO) phase ramp value prior to mapping the phase to amplitude with a sine look up table.

Alternatively, the complex A/D samples can be collected using a periodic clock that is derived directly from the sine wave generator such that alternating A/D samples represent real in-phase (I) and imaginary quadrature-phase (Q) samples. Demultiplexing of the alternating I and Q samples is done by microprocessor 270. This method offers the additional benefit of measuring I and Q samples very close together in time thereby allowing more rapid impedance measurements to be made. A/D sampling frequencies that satisfy this method are given by $4*F_{sine}/(2*m+1)$ where m is any positive integer.

Depending upon the value of m selected, the digital sample values from A/D 265 that result are given sequentially by:

$$I_k, (+/-)Q_{k+1}, -I_{k+2}, (-/+)Q_{k+3}$$

where k represents a sample time index and the sign pattern repeats every four samples. The sequence of samples is de-multiplexed into in-phase and quadrature-phase serial sample streams and the signs are corrected when computing the average I and Q sample values.

Digital signal processing (DSP) calculations compute the unknown load impedance from the A/D sample batches. The DSP calculations determine the source impedance from the multiple load condition readings. The instrument calculates the unknown load impedance from the A/D samples taken while the unknown load is connected to the instrument by effectively eliminating the source impedance from the measurement.

The basic calculation used is a complex-valued version of the voltage divider formula:

$$V_L = V_S[R_L/(R_L + R_S)]$$

where S denotes source, L denotes load. $V_L$ is the measurement at the common switch node. $V_S$ is the sine generator voltage with associated $R_S$ source impedance. $R_L$ is the known or unknown load connected through switch 210. As used here, R is impedance, with an alternative label of Z.

$V_L$ is measured with $R_L$ set to an open circuit (position 212) to determine $V_S$. $V_L$ is then measured with a known load (position 216). $R_S$ is calculated by rearranging the voltage divider formula and evaluating the equation with the calculated value of $V_S$ and known value of $R_L$. Once $R_S$ is known, $V_L$ is measured again with the unknown load connected (position 214). $R_L$ is calculated by rearranging the formula and evaluating the equation with the measured value of $V_L$ and the calculated values of $V_S$ and $R_S$.

These calculations may be adapted to work with samples that are not 90 degrees apart. In such cases, Hilbert transform techniques can be used to convert the scalar sample sequence into the desired complex sample sequence.

Digital signal processing calculations can be performed by microprocessor 270, which reads samples from A/D 265. Microprocessor 270 also outputs data to LCD display 280 to present the impedance measurement results in numeric, text, and graphical form. Keypad 282 allows user parameter entry such as the frequency of test. Data can be transmitted through an external data port 285 that can also receive instrument commands. A suitable microprocessor is an 89C51 8-bit processor. Sample processing can be performed using fixed-point or floating-point calculations.

Control logic 230 controls the operation and parameters of various elements of the system, including the position of switch 210. Control logic 230 can be implemented using a combination of digital logic and microprocessor 270. The digital logic can be incorporated into a field programmable gate array (FPGA).

There are several possible variations of the present invention. Instead of one A/D converter that is clocked at varying phases of the test signal, multiple A/D converters can be clocked with phase-shifted sampling clocks to obtain complex samples. The test signal could alternatively be a square wave, triangle wave, or other shaped signal so long as unwanted harmonic frequency terms that would otherwise cause measurement errors due to aliasing errors are filtered out prior to the A/D conversion step. A complex fast-Fourier transform (FFT) made on a series of samples can be use to compute impedance, allowing the use of non-synchronous sampling.

As an alternative to local DSP processing, raw A/D samples can be transferred to another device for processing. Computation on the A/D samples can be performed with a software-based calculation or hardware-based calculation.

One possible source of measurement error in the system is A/D converter 265. The blocks of I and Q samples are taken at a fixed sampling phase and therefore approximately the same A/D sample voltage values. The errors associated with the A/D converter as well as the number of quantization bits required in the converter can be minimized by having the clock generator sample the sine wave with a sampling frequency that is slightly offset from a synchronous sampling frequency so that the A/D is exercised over its entire input voltage range during the measurement. The I and Q samples are de-multiplexed in the same manner as described above, and the beat frequency between the generator and sampling frequencies is subsequently eliminated by mathematically de-rotating the I and Q samples in the processor before doing the block averaging. The averaging can reduce errors associated with A/D nonlinearities and quantization effects.

In an alternative embodiment, the impedance measurement of an unknown load can be achieved by using an excitation generator with a known source impedance. The calculation of the unknown load can be made by measuring the applied excitation voltage and using then known source impedance in the voltage divider formula. A further alternative, more than two known loads can be used to calibrate the source impedance of the excitation generator.

In another alternative embodiment, the excitation signal can be upconverted to a higher frequency, applied to the loads, then downconverted before being applied to the A/D converters. This approach enables extending the upper frequency range of measurements while operating the A/D at lower frequencies.

Figure 3:
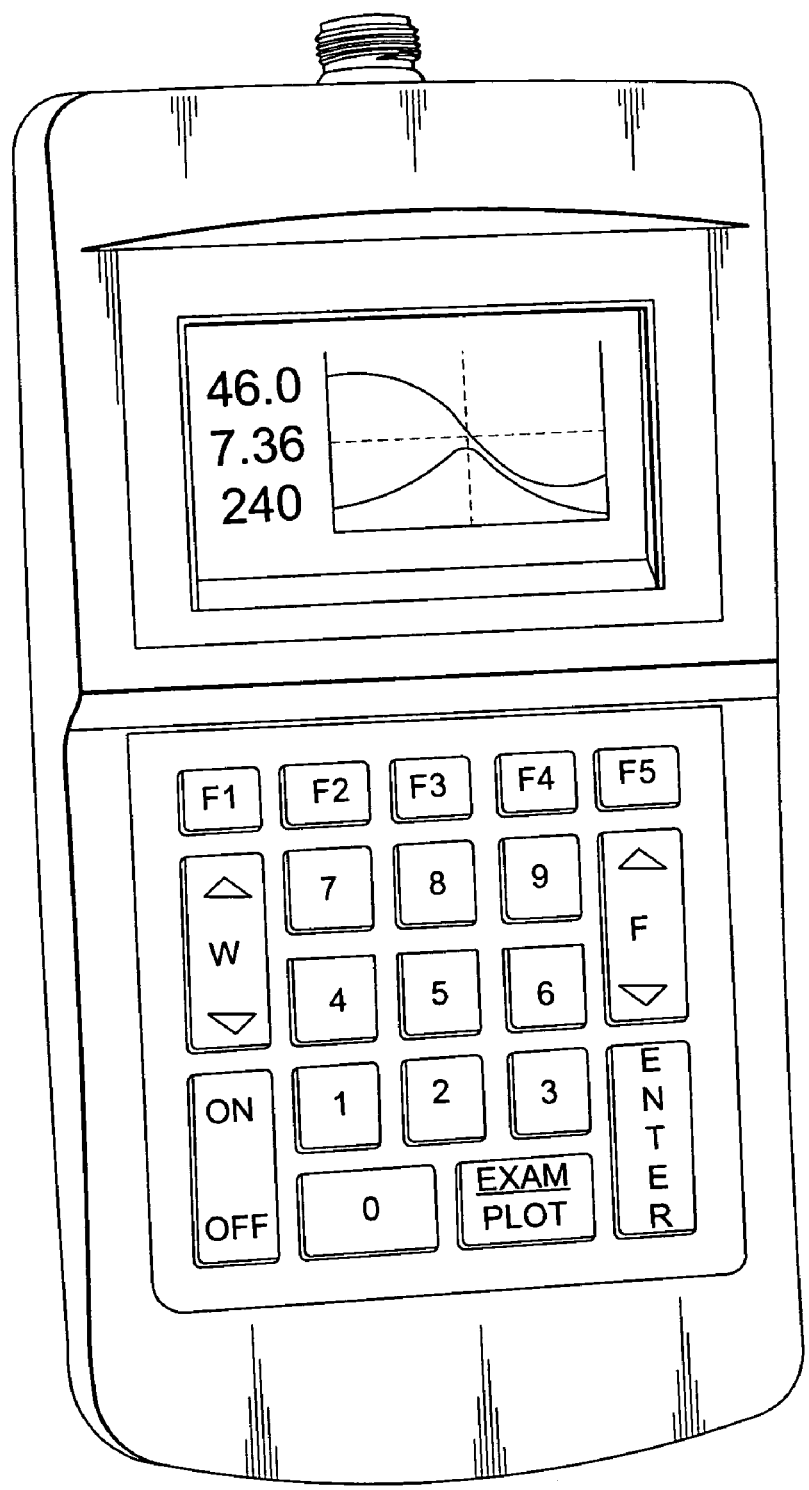
FIG. 3 shows a hand held measurement instrument embodying the present invention.

FIG. 3 shows a hand held measurement instrument embodying the present invention.

What is claimed is:

1. A single port impedance measurement device for determining an unknown load impedance comprising:
    a signal generator with a source impedance that produces a sine wave excitation signal;
    a sampling clock generator with a predetermined phase and frequency relationship to the signal generator;
    a multi-position switch for applying the excitation signal to a plurality of loads comprising at least one known load impedance and the unknown load impedance;
    means for measuring the excitation signal applied to the plurality of loads; and
    means for calculating the value of the unknown load impedance from the measurements of the excitation signal applied to the plurality of loads.

2. The impedance measurement device of claim 1 wherein the known load impedances comprise an open circuit and a calibrated resistance.

3. The impedance measurement device of claim 2 wherein the sampling clock generator produces a multi-phase sampling clock that is synchronous to the excitation signal.

4. The impedance measurement device of claim 3 wherein the sampling clock frequency is less than the excitation signal.

5. The impedance measurement device of claim 3 wherein the sampling clock frequency is greater than the excitation signal.

6. The impedance measurement device of claim 4 wherein the means for measuring the excitation signal comprises measuring complex voltage with an analog to digital converter connected directly to the signal generator with a source impedance.

7. The impedance measurement device of claim 6 wherein the means for calculating the unknown load impedance value comprises evaluating the complex voltage divider relationship between the unknown load impedance and the signal generator source impedance.

8. The impedance measurement device of claim 7 further comprising:
   a keypad for entering parameter information;
   a display for displaying impedance measurement data;
   a microprocessor operatively connected to the keypad and display and the impedance measurement device circuitry; and
   a housing;
   whereby the housing contains all components of the device to form a handheld impedance measurement system.

9. The impedance measurement device of claim 8 wherein the signal generator produces an excitation signal over a range of frequencies and a user of the device can specificy a frequency, through the keypad, that is used to measure impedance.

10. A method of determining an unknown load impedance without using a directional coupler comprising the steps of:
   generating a sine wave excitation signal with a generator that has a source impedance and generating a synchronous multi-phase sampling clock signal;
   applying the excitation signal through the common node of a three-position load switch to an open circuit, a reference load, and the unknown load;
   measuring the voltage of the common node at each switch position with an analog to digital converter that is clocked by the synchronous multi-phase sampling clock signal;
   computing the complex value of the generator source impedance using the voltage measurement of the open circuit and the reference load; and
   computing the complex value of the unknown load impedance from the voltage measurement of the unknown load impedance and the computed source impedance.

11. A method of determining an unknown load impedance of a single port device comprising the steps of:
   generating a sine wave excitation signal with a generator that has a source impedance and generating a sampling clock signal with a predetermined relationship to the excitation signal, the generator capable of generating a variable frequency excitation signal;
   applying the excitation signal through the common node of a multi-position load switch to a first known load, a second known load, and the unknown load;
   measuring the voltage of the common node at each switch position with an analog to digital converter that is clocked by the sampling clock signal;
   computing the complex value of the generator source impedance and excitation signal using the voltage measurement of the first known load and the second known load; and
   computing the complex value of the unknown load impedance from the voltage measurement of the unknown load impedance and the computed source impedance and excitation signal.

* * * * *